United States Patent [19]

Tokunaga et al.

[11] Patent Number: 4,980,201

[45] Date of Patent: Dec. 25, 1990

[54] METHOD OF FORMING TUNGSTEN CARBIDE BY CHEMICAL VAPOR DEPOSITION

[75] Inventors: Nobuyuki Tokunaga; Yasushi Kita, both of Ube, Japan

[73] Assignee: Central Glass Company, Limited, Ube, Japan

[21] Appl. No.: 319,707

[22] Filed: Mar. 7, 1989

[30] Foreign Application Priority Data

Mar. 10, 1988 [JP] Japan .................................. 63-57301

[51] Int. Cl.$^5$ ............................................. C23C 16/32
[52] U.S. Cl. .................................. 427/249; 427/255.2; 423/440
[58] Field of Search .................. 427/249, 255.2, 255.1; 423/440; 428/627, 628

[56] References Cited

U.S. PATENT DOCUMENTS

| | | | |
|---|---|---|---|
| Re. 30,626 | 5/1981 | Kaplan et al. | 427/249 |
| 3,368,914 | 2/1968 | Darnell et al. | 427/249 |
| 3,369,920 | 2/1968 | Bourdeau et al. | 427/249 |
| 3,389,977 | 6/1968 | Tarver | 423/440 |
| 3,574,672 | 4/1971 | Tarver | 427/249 |
| 3,814,625 | 6/1974 | Lewin et al. | 427/249 |
| 3,848,062 | 11/1974 | Steiger et al. | 423/440 |
| 4,874,642 | 10/1989 | Garg et al. | 427/255 |

FOREIGN PATENT DOCUMENTS 1326769  8/1973  United Kingdom ............... 423/440

*Primary Examiner*—Shrive Beck
*Assistant Examiner*—Margaret Bueker
*Attorney, Agent, or Firm*—Fleit, Jacobson, Cohn, Price, Holman & Stern

[57] ABSTRACT

The invention relates to a chemical vapor deposition (CVD) method for forming tungsten carbide, $W_3C$, by subjecting a gas mixture of tungsten hexafluoride, hydrogen and an aromatic hydrocarbon, e.g. benzene, to vapor phase reaction at an elevated temperature. The reaction temperature can be lowered to the extent of 250° C. and the reaction can be carried out even at normal pressure, not necessarily under reduced pressure, by proportioning tungsten hexafluoride, hydrogen and the hydrocarbon such that in the gas mixture the atomic ratio of C to W falls in the range from 2 to 10 while the atomic ratio of H to C is not lower than 3. By this method a $W_3C$ film excellent in glossiness can be deposited on various metal parts without adversely affecting the metal parts by the elevated temperature.

12 Claims, No Drawings

METHOD OF FORMING TUNGSTEN CARBIDE BY CHEMICAL VAPOR DEPOSITION

BACKGROUND OF THE INVENTION

This invention relates to a method of forming tungsten carbide represented by the formula $W_3C$ by a vapor phase chemical interaction between tungsten hexafluoride and a mixture of hydrogen and an aromatic hydrocarbon. In particular the method is suitable for the deposition of a $W_3C$ film on a metal surface.

It is known that hard and coherent coatings of tungsten carbide are very effective for enhancement of wear resistance and durability of cutting tools and machine parts. It is possible to deposit a tungsten carbide film on a metal surface by plasma spraying or flame spraying, but in either case it is difficult to form a film sufficiently high in density and good in tightness of adhesion to the metal surface.

On the other hand, chemical vapor deposition (CVD) techniques have proved to be capable of providing tungsten carbide coatings far better in both density and adhesion to the metal surfaces. In forming tungsten carbide by CVD a preferred source of tungsten is tungsten hexafluoride, and studies have been made on vapor phase reactions between tungsten hexafluoride and various kinds of reducing gas mixtures containing a carbon source.

In general the vapor phase reactions have to be carried out at considerably high temperatures for depositing desired tungsten carbide films. For example, GB 1326769 shows forming a coating of tungsten carbide of the chemical form of WC or $W_2C$ by vapor phase reaction between tungsten hexafluoride and a mixed gas of hydrogen and an aromatic hydrocarbon such as benzene at temperatures between 400° C. and 1000° C. Since such high temperatures adversely affect the metal materials of the articles subjected to coating, restrictions are placed on the applications of this coating method to precision metal parts.

JP 62-15484 shows that vapor phase reaction between tungsten hexafluoride and a mixture of hydrogen and an aromatic hydrocarbon for the depostion of tungsten carbide can be accomplished at relatively low reaction temperatures, viz. at 350°–500° C., by limiting the atomic ratio of tungsten to carbon in the reaction mixture within the range of from 3 to 6. By X-ray diffraction analysis the tungsten carbide films obtained by this method proved to be of the chemical form of $W_3C$. It is a merit of this method that, compared with WC films and $W_2C$ films, $W_3C$ films are superior in surface gloss and wear resistance and hence are of higher commercial value. However, even in this method the reaction temperature needs to be at a level of about 400° C. for practical accomplishment of the deposition of excellent tungsten carbide films, and hence still there are considerable limitations on industrial applications of this method. Furthermore, this method entails costly equipment and intricate operations because the vapor phase reaction must be carried out under reduced pressure, usually at or below about 150 Torr. Besides, $W_3C$ films formed by this method are not fully satisfactory in respect of glossiness.

SUMMARY OF THE INVENTION

The present invention is concerned with formation of tungsten carbide represented by the formula $W_3C$ by chemical vapor deposition using a gaseous mixture of tungsten hexafluoride, an aromatic hydrocarbon and hydrogen, and the invention has an object of providing an improved method by which $W_3C$ coatings of excellent properties can be formed at fairly low temperatures that scarcely influence the metal materials subjected to coating and even under the atmospheric pressure.

According to the invention there is provided a method of forming tungsten carbide represented by the formula $W_3C$ by subjecting a gas mixture of tungsten hexafluoride, an aromatic hydrocarbon and hydrogen to vapor phase reaction at an elevated temperature, the method being characterized in that the three components of the gas mixture are proportioned such that in the gas mixture the atomic ratio of carbon to tungsten is in the range of from 2 to 10 and that in the gas mixture the atomic ratio of hydrogen to carbon is not lower than 3.

By this method it is possible to form either a powder or a film of $W_3C$. The vapor phase reaction for forming $W_3C$ can be carried out at temperatures not lower than 250° C. The upper limit of the reaction temperature is not strictly defined. In general, relatively high temperatures are favorable for producing $W_3C$ powder whereas relatively low temperatures are favorable for producing $W_3C$ films on metal or other solid surfaces. Therefore, in the case of forming a film of tungsten carbide on a substrate by the method according to the invention it is suitable to carry out the aforementioned vapor phase reaction at a temperature in the range from 250° to 500° C.

Thus an important merit of the invention resides in that an excellent tungsten film can be deposited on, for example, a metal surface even at a temperature lower than 300° C. Therefore, for many kinds of metal materials it is possible to accomplish the object of coating with tungsten carbide with little adverse influence on the metal materials. That is, the invention is widely applicable to various machine parts including the parts of precision instruments. Tungsten carbide films formed by this invention are very high in hardness and density and very good in glossiness of surface and tightness of adhesion to the substrates.

Another important merit of the invention is that the deposition of a tungsten film on a metal surface can be accomplished under the atmospheric pressure. In that case the vapor phase reaction can be carried out in a relatively simple and low-cost apparatus, and the operations are also simplified. Furthermore, productivity is improved since the rate of deposition of tungsten carbide is high when the reaction is carried out under the atmospheric pressure. However, it is free to perform the CVD operation according to the invention under reduced pressure. When great importance is attached to the appearance of the deposited tungsten carbide film, deposition under reduced pressure is favorable because of the possibility of enhancing both uniformity and glossiness of the deposited film.

DESCRIPTION OF THE PREFERRED EMBODIMENTS

In this invention the source of tungsten for forming tungsten carbide is always tungsten hexafluoride. The source of carbon is an aromatic hydrocarbon which is usually selected from aryl hydrocarbons such as, for example, benzene, toluene and xylene. Preferred is benzene which is relatively high in vapor pressure and is convenient for use as an industrial raw material.

The proportion of the aromatic hydrocarbon to tungsten hexafluoride is variable on condition that the ratio of carbon in the hydrocarbon to tungsten in the hexafluoride falls in the range from 2 to 10 in terms of atomic ratio, C/W. If the quantity of the hydrocarbon is so small that the atomic ratio of carbon to tungsten does not reach 2 it is difficult to obtain a pure $W_3C$ film, and in most cases a film of a mixture of $W_3C$ and tungsten (W) is obtained. The films containing elementary W are inferior to pure $W_3C$ films in physical properties including surface gloss and wear resistance. On the other hand, it raises a little problem to increase the quantity of the aromatic hydrocarbon to such an extent that the atomic ratio of carbon to tungsten exceeds 10, though it means wasting a considerable amount of the hydrocarbon and hence is uneconomical.

In this invention there is a limitation to the quantity of hydrogen gas which needs to be used together with the above described sources of tungsten and carbon. That is, in the gas mixture of an aromatic hydrocarbon, tungsten hexafluoride and hydrogen the amount of hydrogen gas must be such that the ratio of hydrogen (including hydrogen of the hydrocarbon) to carbon becomes at least 3 in terms of atomic ratio, H/C. If the atomic ratio of hydrogen to carbon is lower than 3 the CVD process gives a film of a mixture of $W_3C$ and W.

A gaseous mixture of these raw materials is subjected to vapor phase reaction by appropriate heating. As described hereinbefore, the reaction temperature is widely variable insofar as it is not lower than 250° C., though it is preferred to employ a reaction temperature not higher than 500° C. when forming a film of $W_3C$ on a metal or other solid surface.

Although the material of the solid surface for deposition of $W_3C$ thereon is not limited, the merits of the invention are fully exhibited when aluminum is the substrate material. Aluminum is low in specific gravity and has many favorable properties but is not high in surface hardness and hence is low in wear resistance. This shortcoming is obviated by coating with a good film of tungsten carbide. In particular, when the invention is applied to aluminum of 98% or higher purity the deposited $W_3C$ film very strongly adheres to the aluminum surface.

The vapor phase reaction can be carried out at normal pressure and, if desired for forming a $W_3C$ film of very high quality, may be carried out under reduced pressure.

Aside from the above described limitations and conditions, the vapor phase reaction according to the invention can be performed by using conventional CVD techniques.

The invention is further illustrated by the following nonlimitative examples.

EXAMPLE 1

A conventional CVD apparatus of a horizontal flow type was used. The apparatus had a cylindrical reactor 40 cm in inner diamter, 100 cm in the whole length and 60 cm in the length of a homogeneous temperature zone. In the center of the homogeneous temperature zone, a strip of nickel sheet 2 cm in width, 5 cm in length and 2 mm in thickness was placed as a substrate to be coated with tungsten carbide, and the interior of the reactor was kept heated. In that state a mixed gas of the raw materials was continuously introduced into the reactor by a nozzle provided at one end of the reactor. The above apparatus and conditions were employed not only in this example but also in the subsequent examples and comparative examples.

In this example, a mixed gas of tungsten hexafluoride, benzene and hydrogen in the proporsions of 2.2:1:33 by mol was used. In the mixed gas the C/W atomic ratio was 2.7 and the H/C atomic ratio was 11. In the reactor the homogeneous temperature zone was maintained at 400° C. Under the atmospheric pressure the mixed gas was continuously introduced into the reactor for 30 min at a flow rate of 7.8 liters per minute. As the result a hard and glossy film having a thickness of 19 μm was formed on the surface of the nickel strip. From X-ray diffraction pattern the film was confirmed to be a pure $W_3C$ film.

EXAMPLE 2

A mixed gas of tungsten hexafluoride, benzene and hydrogen in the proportions of 1.4:1:10 by mol was used. In the mixed gas the C/W atomic ratio was 4.3, and the H/C atomic ratio was 3.3. In the reactor the homogeneous temperature zone was maintained at 300° C. Under the atmospheric pressure the mixed gas was continuously introduced into the reactor for 60 min at a flow rate of 2.1 l/min. As the result a hard and glossy film having a thickness of 12 μm was formed on the surface of the nickel strip. From X-ray diffraction pattern this film was confirmed to be a pure $W_3C$ film.

EXAMPLE 3

A mixed gas of tungsten hexafluoride, benzene and hydrogen in the proportions of 2.7:1:42 by mol was used. In the mixed gas the C/W atomic ratio was 2.2, and the H/C atomic ratio was 7.0. In the reactor the homogeneous temperature zone was maintained at 250° C. Under the atmospheric pressure the mixed gas was continuously introduced into the reactor for 90 min at a flow rate of 7.6 l/min. As the result a hard and glossy film having a thickness of 9 μm was formed on the surface of the nickel strip. From X-ray diffraction pattern this film was confirmed to be a pure $W_3C$ film.

COMPARATIVE EXAMPLE 1

A mixed gas of tungsten hexafluoride, benzene and hydrogen in the proportions of 16:1:233 by mol was used. In the mixed gas the C/W atomic ratio was only 0.38, and the H/C atomic ratio was 78. In the reactor the homogeneous temperature zone was maintained at 400° C. Under the atmospheric pressure the mixed gas was continuously introduced into the reactor for 30 min at a flow rate of 7.5 l/min. As the result a glossless film having a thickness of 21 μm was formed on the surface of the nickel strip. From X-ray diffraction pattern this film was confirmed to be formed of a mixture of W and $W_3C$.

COMPARATIVE EXAMPLE 2

A mixed gas of tungsten hexafluoride, benzene and hydrogen in the proportions of 2.9:1:8.1 by mol was used. In the mixed gas the C/W atomic ratio reached 2.8, and the H/C atomic ratio was only 2.7. In the reactor the homogeneous temperature zone was maintained at 400° C. Under the atmospheric pressure the mixed gas was continuously introduced into the reactor for 60 min at a flow rate of 1.0 l/min. As the result a film having a thickness of 30 μm was formed on the nickel strip. This film was glossy but assumed a slightly bluish color. From X-ray diffraction pattern this film was confirmed to be formed of a mixture of W and $W_3C$.

EXAMPLE 4

A mixed gas of tungsten hexafluoride, benzene and hydrogen in the proportions of 1.7:1:31 by mol was used. In the mixed gas the C/W atomic ratio was 3.5, and the H/C atomic ratio was 10. In the reactor the homogeneous temperature zone was maintained at 400° C. Under reduced pressure of 90 Torr (total gas pressure) the mixed gas was continuously introduced into the reactor for 60 min at a flow rate of 2.4 l/min. As the result a hard and glossy film having a thickness of 9 μm was formed on the surface of the nickel strip. From X-ray diffraction pattern this film was confirmed to be a pure $W_3C$ film. Compared with the films formed in Examples 1 to 3, this $W_3C$ film was superior in uniformity, surface smoothness and glossiness.

EXAMPLE 5

The CVD operation of Example 4 was repeated except that the reaction temperature was lowered to 300° C. and that the reaction (feed of the mixed gas) was continued for 120 min. As the result a pure $W_3C$ film having a thickness of 8 μm was formed on the nickel strip. By appearance this film did not appreciably differ from the film formed in Example 4.

COMPARATIVE EXAMPLE 3

A mixed gas of tungsten hexafluoride, benzene and hydrogen in the proportions of 20:1:367 by mol was used. In the mixed gas the C/W atomic ratio was only 0.31, and the H/C atomic ratio was 121. Except this change, the CVD operation of Example 4 was repeated. In this case the thickness of the film formed on the nickel strip was only 4 μm. From X-ray diffraction pattern this film was confirmed to be formed of a mixture of W and $W_3C$. This film was considerably inferior in surface gloss and surface smoothness to the $W_3C$ film formed in Example 4, and locally the film surface was rough.

COMPARATIVE EXAMPLE 4

The CVD operation of Comparative Example 3 was repeated except that the reaction temperature was lowered to 300° C. and that the reaction (feed of the mixed gas) was continued for 120 min. Also in this case a film of a mixture of W and $W_3C$ was formed on the nickel strip. The thickness of the film was only 3 μm.

What is claimed is:

1. A method of forming tungsten carbide represented by the formula $W_3C$ by subjecting a gas mixture of tungsten hexafluoride, an aromatic hydrocarbon and hydrogen to vapor phase reaction at an elevated temperature, characterized in that said tungsten hexafluoride, said aromatic hydrocarbon and said hydrogen are proportioned such that in said gas mixture the atomic ratio of carbon to tungsten is in the range from 2 to 10 and that in said gas mixture the atomic ratio of hydrogen to carbon is not lower than 3.

2. A method according to claim 1, wherein said aromatic hydrocarbon is an aryl hydrocarbon.

3. A method according to claim 2, wherein said aryl hydrocarbon is benzene.

4. A method according to claim 1, wherein said elevated temperature is not lower than 250° C.

5. A method according to claim 1, wherein said vapor phase reaction is carried out at normal pressure.

6. A method according to claim 1, wherein said vapor phase reaction is carried out under reduced pressure.

7. A method of depositing a film of tungsten carbide represented by the formula $W_3C$ on a metal substrate by subjecting a gas mixture of tungsten hexafluoride, an aromatic hydrocarbon and hydrogen at an elevated temperature in a chamber in which said substrate is placed, characterized in that said tungsten hexafluoride, said aromatic hydrocarbon and said hydrogen are proportioned such that in said gas mixture the atomic ratio of carbon to tungsten is in the range from 2 to 10 and such that in said gas mixture the atomic ratio of hydrogen to carbon is not lower than 3, and that said elevated temperature is in the range from 250° to 500° C.

8. A method according to claim 7, wherein said aromatic hydrocarbon is an aryl hydrocarbon.

9. A method according to claim 8, wherein said aryl hydrocarbon is benzene.

10. A method according to claim 7, wherein said vapor phase reaction is carried out at normal pressure.

11. A method according to claim 7, wherein said vapor phase reaction is carried out under reduced pressure.

12. A method according to claim 7, wherein said substrate is a nickel sheet.

* * * * *